(12) United States Patent
Lajoie et al.

(10) Patent No.: US 12,426,247 B2
(45) Date of Patent: Sep. 23, 2025

(54) CAPACITOR CONNECTIONS IN DIELECTRIC LAYERS

(71) Applicant: Intel Corporation, Santa Clara, CA (US)

(72) Inventors: Travis W. Lajoie, Forest Grove, OR (US); Abhishek A. Sharma, Hillsboro, OR (US); Van H. Le, Portland, OR (US); Chieh-Jen Ku, Hillsboro, OR (US); Pei-Hua Wang, Beaverton, OR (US); Jack T. Kavalieros, Portland, OR (US); Bernhard Sell, Portland, OR (US); Tahir Ghani, Portland, OR (US); Gregory George, Beaverton, OR (US); Akash Garg, Portland, OR (US); Allen B. Gardiner, Portland, OR (US); Shem Ogadhoh, Beaverton, OR (US); Juan G. Alzate Vinasco, Tigard, OR (US); Umut Arslan, Portland, OR (US); Fatih Hamzaoglu, Portland, OR (US); Nikhil Mehta, Portland, OR (US); Jared Stoeger, Portland, OR (US); Yu-Wen Huang, Beaverton, OR (US); Shu Zhou, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/381,119

(22) Filed: Oct. 17, 2023

(65) Prior Publication Data

US 2024/0049450 A1 Feb. 8, 2024

Related U.S. Application Data

(63) Continuation of application No. 16/457,634, filed on Jun. 28, 2019, now Pat. No. 11,832,438.

(51) Int. Cl.
*H10B 12/00* (2023.01)
*H10D 1/68* (2025.01)
(Continued)

(52) U.S. Cl.
CPC ....... *H10B 12/315* (2023.02); *H10B 12/0335* (2023.02); *H10B 12/312* (2023.02);
(Continued)

(58) Field of Classification Search
CPC ........ H10D 1/042; H10D 1/043; H10D 1/716; H01L 28/90–92
See application file for complete search history.

(56) References Cited

U.S. PATENT DOCUMENTS

| 5,428,237 A | 6/1995 | Yuzurihara |
| 5,858,831 A * | 1/1999 | Sung .................. H10D 84/038 257/E21.654 |

(Continued)

*Primary Examiner* — Amar Movva
(74) *Attorney, Agent, or Firm* — Schwabe, Williamson & Wyatt, P.C.

(57) ABSTRACT

Embodiments herein describe techniques for a semiconductor device including a substrate. A first capacitor includes a first top plate and a first bottom plate above the substrate. The first top plate is coupled to a first metal electrode within an inter-level dielectric (ILD) layer to access the first capacitor. A second capacitor includes a second top plate and a second bottom plate, where the second top plate is coupled to a second metal electrode within the ILD layer to access the second capacitor. The second metal electrode is disjoint from the first metal electrode. The first capacitor is accessed through the first metal electrode without accessing the second capacitor through the second metal electrode. Other embodiments may be described and/or claimed.

20 Claims, 8 Drawing Sheets

(51) Int. Cl.
*H10D 86/40* (2025.01)
*H10D 86/60* (2025.01)

(52) U.S. Cl.
CPC ............. *H10D 1/682* (2025.01); *H10D 1/694* (2025.01); *H10D 1/711* (2025.01); *H10D 86/411* (2025.01); *H10D 86/421* (2025.01); *H10D 86/423* (2025.01); *H10D 86/441* (2025.01); *H10D 86/451* (2025.01); *H10D 86/481* (2025.01); *H10D 86/60* (2025.01)

(56) References Cited

U.S. PATENT DOCUMENTS

| | | | |
|---|---|---|---|
| 5,893,734 A | | 4/1999 | Jeng |
| 6,800,515 B2 | | 10/2004 | Piazza |
| 2002/0017673 A1 | * | 2/2002 | Maeda ............... H01L 21/76807 |
| | | | 257/E21.656 |
| 2004/0000686 A1 | | 1/2004 | Houston |
| 2011/0241166 A1 | * | 10/2011 | Chumakov .......... H10D 84/038 |
| | | | 257/532 |
| 2016/0117219 A1 | * | 4/2016 | Halbert ................ G06F 11/076 |
| | | | 714/799 |

* cited by examiner

CAPACITOR CONNECTIONS IN DIELECTRIC LAYERS

CROSS-REFERENCE TO RELATED APPLICATIONS

This application is a continuation of U.S. patent application Ser. No. 16/457,634, filed on Jun. 28, 2019, the entire contents of which is hereby incorporated by reference herein.

FIELD

Embodiments of the present disclosure generally relate to the field of semiconductor devices, and more particularly, to capacitors in dielectric layers at the back-end-of-line of semiconductor processing.

BACKGROUND

Capacitors may be used in memory devices, which are important parts of integrated circuits (IC) and semiconductor devices. A memory device, e.g., a dynamic random access memory (DRAM) array, may include a plurality of memory cells, where a memory cell may include a selector, e.g., a transistor, to control the access to a storage cell, e.g., a capacitor. A silicon transistor in a substrate or a thin-film transistor (TFT) in the back-end-of-line of semiconductor processing may be used as a selector for a memory device. However, current designs and implementations of memory devices, e.g., DRAM devices, still face many challenges. In addition to memory devices, capacitors may be used in many other applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
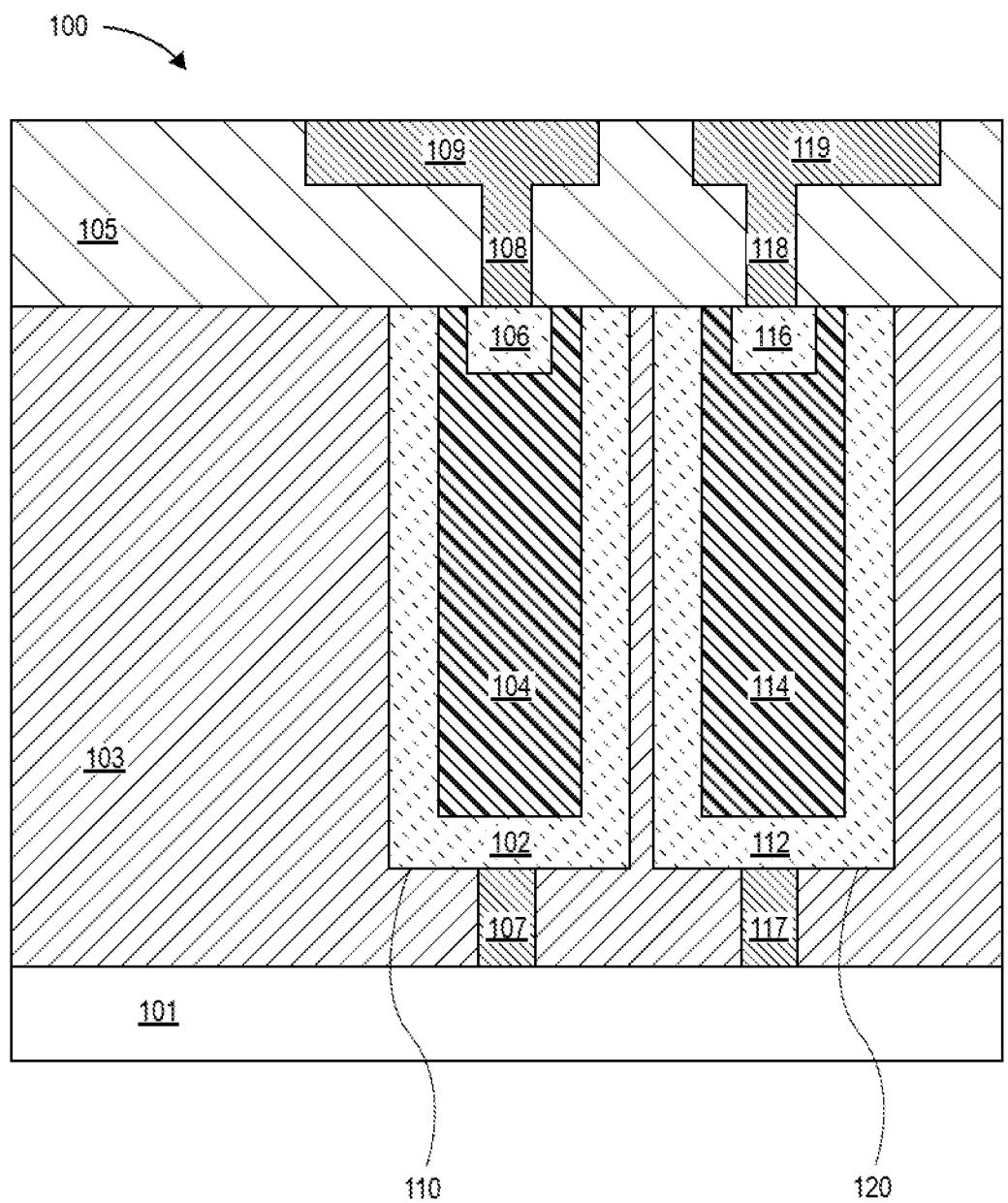
FIGS. 1(a)-1(c) schematically illustrate diagrams of a semiconductor device including a first capacitor and a second capacitor, in accordance with some embodiments.

Memory devices are important parts of integrated circuits (IC) and semiconductor devices. High density or high bandwidth memory devices may be particularly useful for many applications, e.g., graphics, artificial intelligence, machine learning, or compute in or near memory. Dynamic random access memory (DRAM), or an enhanced or embedded dynamic random access memory (eDRAM), may be one of the leading candidates for high density or high bandwidth memory devices. A memory array, e.g., a DRAM or an eDRAM, may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. In detail, the capacitor can either be charged or discharged; these two states are taken to represent the two values of a bit, conventionally called 0 and 1. Accessing a capacitor in a memory cell may refer to read the state, e.g., charged or discharged, of the capacitor, or to change a state, e.g., store data, of the capacitor. To store data, a voltage is applied to charge or discharge the memory cell storage capacitor to the desired state. Accessing a capacitor in a memory cell may also refer to any other memory operations to be performed on the memory cell and the capacitor.

Memory devices may be implemented with capacitor over bit (COB). However, conventional implementations of memory devices, e.g., 1T1C device, may face some problems. For example, in some current implementations, multiple memory cells of a memory device may have multiple capacitors electrically coupled by their top plates without access to an individual capacitor. Accordingly, the multiple capacitors of the multiple memory cells can only be accessed, charged, or discharged, together at once. Such a connection scheme for multiple memory cells may limit the connectivity between the memory device and logic circuits. Furthermore, memory devices including multiple memory cells with multiple capacitors electrically coupled by their top plates may be less reliable. For example, if a top plate of a capacitor within one memory cell is shorted, all other memory cells with capacitors having their top plates coupled to the faulty capacitor will be shorted as well.

Embodiments herein present a memory device including individual capacitor coupled to different bit line of the memory device. A first capacitor of a first memory cell of a memory array includes a first top plate coupled to a first metal electrode, while a second capacitor of a second memory cell of the memory array includes a second top plate coupled to a second metal electrode disjoint from the first metal electrode. Hence, the first top plate is not directly coupled to the second top plate so that a logic circuit accessing the first capacitor may not access the second capacitor. To the contrary, the first capacitor is accessed by a logic circuit through the first metal electrode without accessing the second capacitor through the second metal electrode. The so formed first capacitor and second capacitor may allow more complex usage of the memory array. In addition, such a memory device will be more reliable as well. In some embodiments, a via may function as a top plate of a capacitor, which may further simplify the processing steps by eliminating the top plate. Moreover, capacitors presented in embodiments herein may be used in applications other than memory arrays or memory devices.

Embodiments herein present a semiconductor device including a substrate. A first capacitor includes a first top plate and a first bottom plate above the substrate. The first top plate is coupled to a first metal electrode within an inter-level dielectric (ILD) layer to access the first capacitor. A second capacitor includes a second top plate and a second bottom plate, where the second top plate is coupled to a second metal electrode within the ILD layer to access the second capacitor. The second metal electrode is disjoint from the first metal electrode. The first capacitor is accessed through the first metal electrode without accessing the second capacitor through the second metal electrode.

Embodiments herein present a method for forming a semiconductor device. The method includes forming a first inter-level dielectric (ILD) layer above a substrate. In addition, the method includes forming a first bottom plate of a first capacitor and a second bottom plate of a second capacitor within the first ILD layer; forming a first capacitor dielectric layer adjacent to and above the first bottom plate, and a second capacitor dielectric layer adjacent to and above the second bottom plate; and forming a first top plate of the first capacitor adjacent to and above the first capacitor dielectric layer, and a second top plate of the second capacitor adjacent to and above the second capacitor dielectric layer. Furthermore, the method includes forming a first metal electrode within a second ILD layer and coupled to the first top plate, and forming a second metal electrode within the second ILD layer and coupled to the second top plate. The second metal electrode is disjoint from the first metal electrode. The first capacitor is accessed through the first metal electrode without accessing the second capacitor through the second metal electrode.

Embodiments herein present a computing device, which includes a circuit board, and a memory device coupled to the circuit board and including a memory array. In more detail, the memory array may include a plurality of memory cells. A first memory cell of the plurality of memory cells includes a first transistor and a first capacitor, and a second memory cell of the plurality of memory cells includes a second transistor and a second capacitor. The first capacitor includes a first bottom plate and a first top plate, where the first top plate is coupled to a first metal electrode within an inter-level dielectric (ILD) layer to access the first capacitor. The second capacitor includes a second top plate and a second bottom plate, where the second top plate is coupled to a second metal electrode within the ILD layer to access the second capacitor. The second metal electrode is disjoint from the first metal electrode. The first capacitor is accessed through the first metal electrode without accessing the second capacitor through the second metal electrode.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin film transistor (TFT) is a kind of field-effect transistor formed at BEOL and including a channel layer, a gate electrode, and source and drain electrodes, over a supporting but non-conducting substrate.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
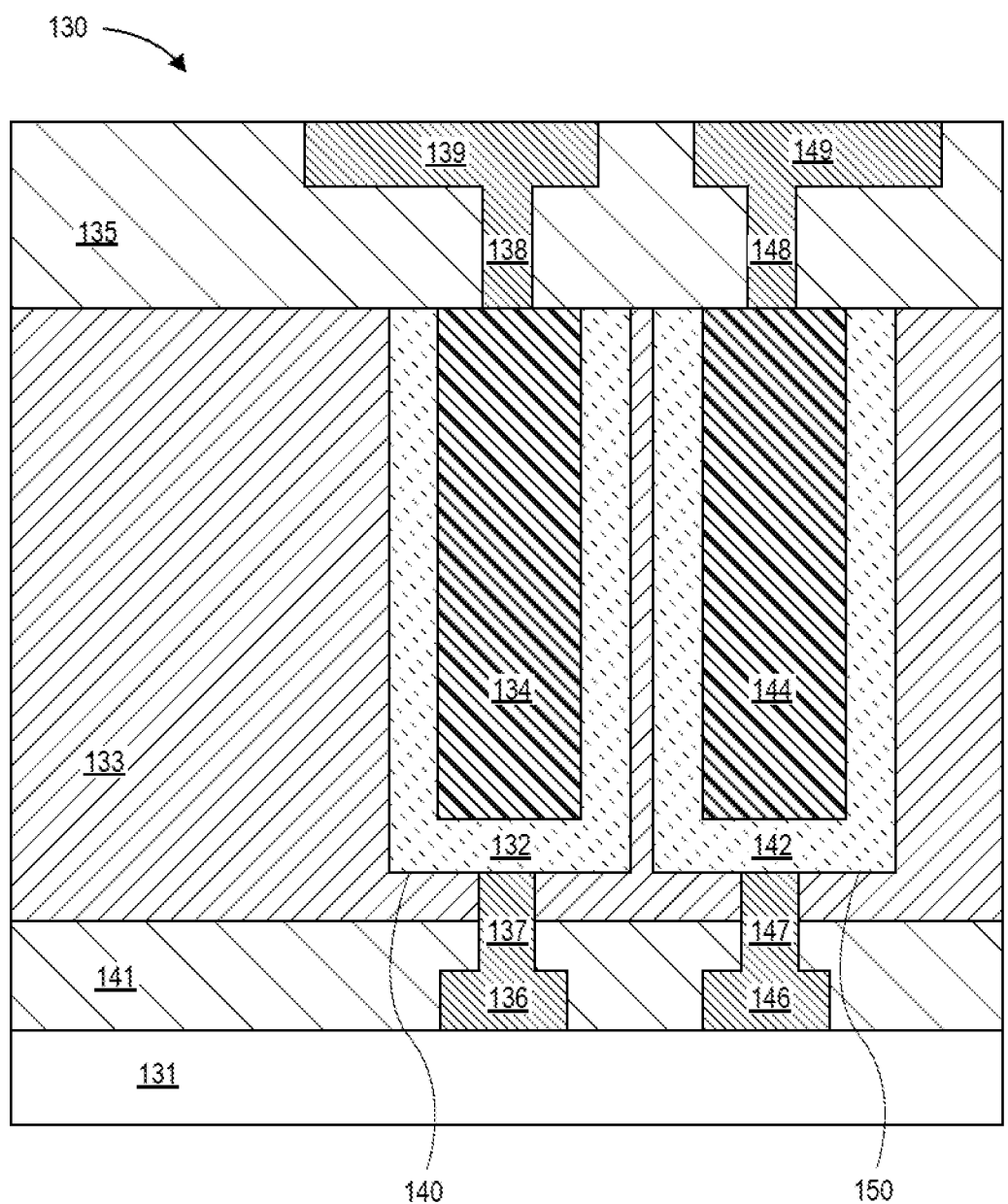
Figure 1C:
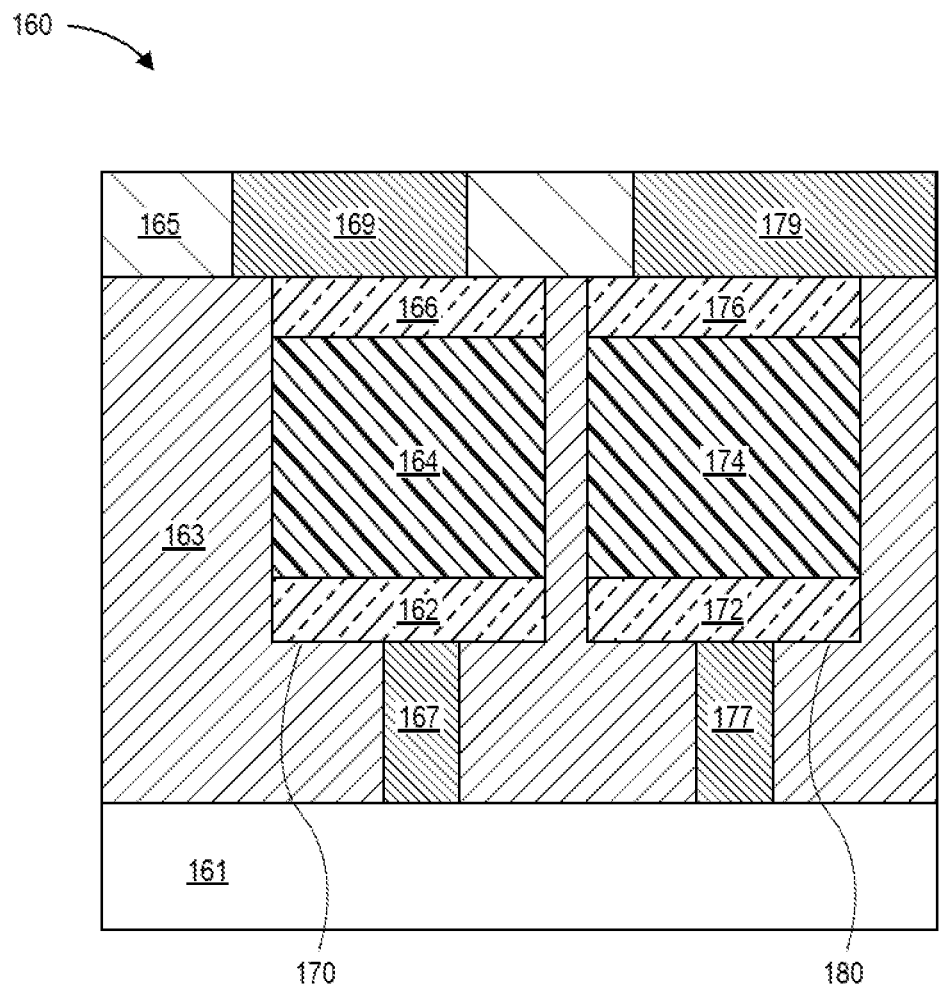

FIGS. 1(a)-1(c) schematically illustrate diagrams of a semiconductor device including a first capacitor and a second capacitor, in accordance with some embodiments. FIG. 1(a) shows a semiconductor device 100 including a capacitor 110 and a capacitor 120. FIG. 1(b) shows a semiconductor device 130 including a capacitor 140 and a capacitor 150. FIG. 1(c) shows a semiconductor device 160 including a capacitor 170 and a capacitor 180.

In embodiments, as shown in FIG. 1(a), the semiconductor device 100 includes a substrate 101, an ILD layer 103 above the substrate 101, and an ILD layer 105 above the ILD layer 103. The ILD layer 103 may include a material different from a material in the ILD layer 105. For example, the dielectric material in the ILD layer 103 may have a higher dielectric constant than the dielectric material in the ILD layer 105. In some other embodiments, the dielectric material in the ILD layer 103 and the ILD layer 105 may be the same. As a result, the ILD layer 103 and the ILD layer 105 is merged into one ILD layer. The layers shown in FIG. 1(a) are only for examples, and there may be many other layers not shown, e.g., an etching stop layer, a passivation layer, or a liner.

In embodiments, the capacitor 110 includes a bottom plate 102 above the substrate 101, a capacitor dielectric layer 104 adjacent to and above the bottom plate 102, and a top plate 106 adjacent to and above the capacitor dielectric layer 104. The top plate 106 is coupled to a metal electrode 109 through a via 108 in the ILD layer 105. In addition, the bottom plate 102 is coupled to a via 107, which may further be coupled to a metal electrode, not shown. A logic circuit may access the capacitor 110 to through the metal electrode 109, the via 108, and the top plate 106. For example, a memory logic circuit may access the capacitor 110 to read, write, or perform any other memory operations through the metal electrode 109, the via 108, and the top plate 106.

In embodiments, the capacitor 120 includes a bottom plate 112 above the substrate 101, a capacitor dielectric layer 114 adjacent to and above the bottom plate 112, and a top plate 116 adjacent to and above the capacitor dielectric layer 114. The top plate 116 is coupled to a metal electrode 119 through a via 118 in the ILD layer 105. In addition, the bottom plate 112 is coupled to a via 117, which may further be coupled to a metal electrode, not shown. A logic circuit, may access the capacitor 120 through the metal electrode 119, the via 118, and the top plate 116. For example, a memory logic circuit may access the capacitor 120 to read, write, or perform any other memory operations through the metal electrode 119, the via 118, and the top plate 116.

In embodiments, the metal electrode 109 and the metal electrode 119 are substantially coplanar with respect to a surface of the substrate 101. In some other embodiments, the metal electrode 109 and the metal electrode 119 may be substantially parallel in a vertical direction with respect to the surface of the substrate. The metal electrode 109 and the metal electrode 119 may be formed in a uniformed process so that they are substantially coplanar or substantially parallel. The metal electrode 109 and the metal electrode 119 are disjoint. Hence, the metal electrode 109 and the metal electrode 119 are physically discrete two different metal electrodes. In addition, a current or voltage may flow through the metal electrode 109 without flowing through the metal electrode 119. Therefore, the metal electrode 109 and the metal electrode 119 may be used to control the capacitor 110 and the capacitor 120 in different states. In some embodiments, the capacitor 110 is accessed through the metal electrode 109 without accessing the capacitor 120 through the metal electrode 119, where to access the capacitor 110 may refer to read or write the capacitor 110 through the metal electrode 109. For example, the capacitor 110 is included in a first bit cell of a memory array, and the capacitor 120 is included in a second bit cell of the memory array. The metal electrode 109 is coupled to a first bit line of the memory array, and the metal electrode 119 is coupled to a second bit line of the memory array different from the first bit line. Therefore, the bit line coupled to the metal electrode 109 and the capacitor 110 can be accessed individually without accessing the bit line coupled to the metal electrode 119 and the capacitor 120.

In embodiments, the bottom plate 102, the bottom plate 112, the capacitor dielectric layer 104, the capacitor dielectric layer 114, the top plate 106, and the top plate 116 may be of various shapes. For example, the bottom plate 102, the bottom plate 112, the capacitor dielectric layer 104, the capacitor dielectric layer 114, the top plate 106, or the top plate 116, may include a U-shaped portion, or may be of a square shape, a rectangular shape, or a polygon comprising three or more sides.

In embodiments, the substrate 101 may include a material selected from the group consisting of a silicon substrate, a glass substrate, a metal substrate, and a plastic substrate. The ILD layer 103 or the ILD layer 105 may include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass. The bottom plate 102, the bottom plate 112, the top plate 106, or the top plate 116 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO. Furthermore, the capacitor dielectric layer 104 or the capacitor dielectric layer 114 may include one or more high-k dielectric materials selected from the group consisting of hafnium silicate, zirconium silicate, hafnium dioxide, hafnium zirconate, zirconium dioxide, aluminum oxide, titanium oxide, silicon nitride, carbon doped silicon nitride, silicon carbide, and nitride hafnium silicate.

In embodiments, as shown in FIG. 1(b), the semiconductor device 130 includes a substrate 131, an ILD layer 141, an ILD layer 133, and an ILD layer 135. Some of the ILD layers may be merged into one ILD layer.

In embodiments, the capacitor 140 includes a bottom plate 132 above the substrate 131, a capacitor dielectric layer 134 adjacent to and above the bottom plate 132. Different from the capacitor 110 in FIG. 1(a), the capacitor 140 does not have a top plate. Instead, a via 138 serves as the top plate.

The via 138 is in contact with the capacitor dielectric layer 134 separating the bottom plate 132 and the via 138. In some embodiments, the via 138 may be extended partially into the capacitor dielectric layer 134. In addition, the via 138 is in contact with a metal electrode 139. A logic circuit, e.g., a memory control circuit, may access the capacitor 140 through the metal electrode 139 and the via 138. Furthermore, the bottom plate 132 is coupled with a metal electrode 136 through a via 137, where the metal electrode 136 is in the ILD layer 141, and the bottom plate 132 is in the ILD 133.

In embodiments, the capacitor 150 includes a bottom plate 142 above the substrate 131, a capacitor dielectric layer 144 adjacent to and above the bottom plate 142. A via 148 serves as the top plate and is in contact with the capacitor dielectric layer 144 separating the bottom plate 142 and the via 148. In addition, the via 148 is in contact with a metal electrode 149. A logic circuit, e.g., a memory control circuit, may access the capacitor 150 through the metal electrode 149 and the via 148. Furthermore, the bottom plate 142 is coupled with a metal electrode 146 through a via 147, where the metal electrode 146 is in the ILD layer 141, and the bottom plate 142 is in the ILD 133.

In embodiments, the metal electrode 139 and the metal electrode 149 are substantially coplanar with respect to a surface of the substrate 131, while the via 138 and the via 148 are substantially parallel in a vertical direction with respect to the surface of the substrate 131. The metal electrode 139 and the metal electrode 149, and the via 138 and the via 148, may be formed in a uniformed process so that they are substantially coplanar or substantially parallel. The metal electrode 139 is disjoint from the metal electrode 149. In some embodiments, the capacitor 140 is accessed through the metal electrode 139 without accessing the capacitor 150 through the metal electrode 149, where to access the capacitor 140 may refer to read, write, or to perform any other memory operations on the capacitor 140 through the metal electrode 139.

In embodiments, as shown in FIG. 1(c), the semiconductor device 160 includes a substrate 161, an ILD layer 163, and an ILD layer 165. In embodiments, the capacitor 170 includes a bottom plate 162 above the substrate 161, a capacitor dielectric layer 164 adjacent to and above the bottom plate 162, and a top plate 166 adjacent to and above the capacitor dielectric layer 164. Different from the capacitors in FIGS. 1(a)-1(b), the capacitor 170 does not have a via coupled to the top plate 166. Instead, a metal electrode 169 is adjacent and in direct contact with the top plate 166. A logic circuit, e.g., a memory control circuit, may access the capacitor 170 through the metal electrode 169 and the top plate 166. Furthermore, the bottom plate 162 is coupled with a via 167, which may be further coupled to a metal electrode, not shown.

In embodiments, the capacitor 180 includes a bottom plate 172 above the substrate 161, a capacitor dielectric layer 174 adjacent to and above the bottom plate 172, and a top plate 176 adjacent to and above the capacitor dielectric layer 174. Different from the capacitors in FIGS. 1(a)-1(b), the capacitor 180 does not have a via coupled to the top plate 176. Instead, a metal electrode 179 is adjacent and in direct contact with the top plate 176. A logic circuit, e.g., a memory control circuit, may access the capacitor 180 through the metal electrode 179 and the top plate 176. Furthermore, the bottom plate 172 is coupled with a via 177, which may be further coupled to a metal electrode, not shown.

In embodiments, the metal electrode 169 and the metal electrode 179 are substantially coplanar with respect to a surface of the substrate 131. The metal electrode 169 and the metal electrode 179 may be formed in a uniformed process so that they are substantially coplanar. The metal electrode 169 is disjoint from the metal electrode 179. In some embodiments, the capacitor 170 is accessed through the metal electrode 169 without accessing the capacitor 180 through the metal electrode 179, where to access the capacitor 170 may refer to read, write, or perform any other memory operations on the capacitor 170 through the metal electrode 169.

Embodiments shown in FIGS. 1(a)-1(c) are examples only and are not limiting. There may be other embodiments not shown. For example, a capacitor may have a top plate directly serve as a metal electrode for interconnect to other signal lines. In detail, the top plate 166 and the metal electrode 169 for the capacitor 170 may be merged into one metal electrode.

Figure 2:
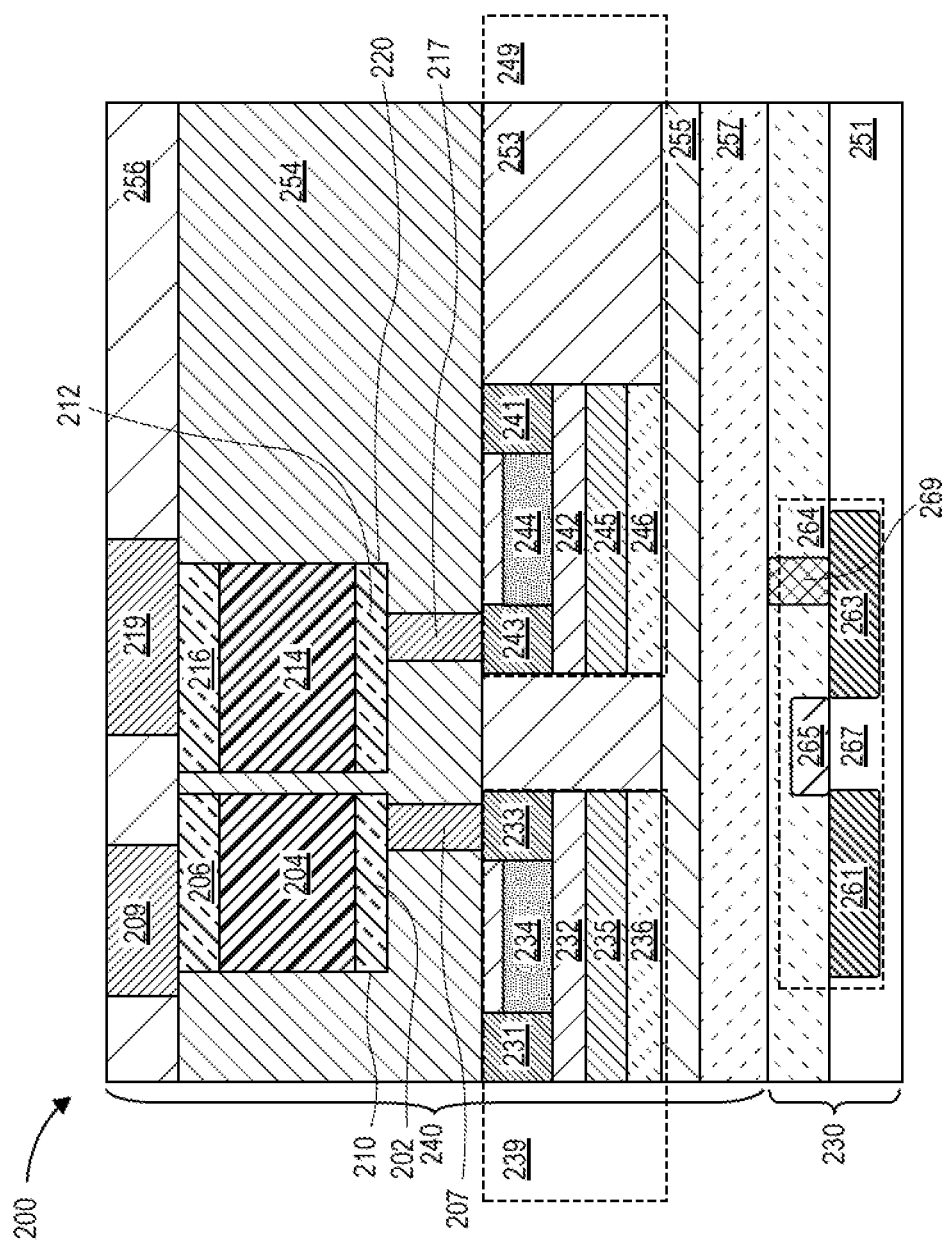
FIG. 2 schematically illustrates a diagram of a semiconductor device including memory cells having a first capacitor and a second capacitor, in accordance with some embodiments.

FIG. 2 schematically illustrates a diagram of a semiconductor device 200 including memory cells having a capacitor 210 and a capacitor 220, in accordance with some embodiments. In embodiments, the capacitor 210 and the capacitor 220 may be similar to the capacitor 170 and the capacitor 180 as shown in FIG. 1(c). In some other embodiments, capacitors similar to the capacitor 110 and the capacitor 120 as shown in FIG. 1(a), or similar to the capacitor 140 and the capacitor 150 as shown in FIG. 1(b), may be used to replace the capacitor 210 and the capacitor 220 as shown in FIG. 2.

In embodiments, the semiconductor device 200 includes a substrate 251, the FEOL 230 including the substrate 251, and the BEOL 240 above the FEOL 230. The BEOL 240 may include an interconnect structure with multiple layers, e.g., an ILD layer 253, an ILD layer 254, an ILD layer 256, and an ILD layer 257, above the substrate 251. There may be many other layers in between. For example, a separation layer 255 lies between the ILD layer 253 and the ILD layer 257.

In embodiments, the BEOL 240 includes a TFT 239 coupled to the capacitor 210 to form a memory cell, and a TFT 249 coupled to the capacitor 220 to form a memory cell. The memory cells shown here are for examples only. In some other embodiments, the capacitor 210 and the capacitor 220 may be coupled to transistors at the FEOL 230 to form memory cells.

In embodiments, the capacitor 210 includes a bottom plate 202 above the substrate 251, a capacitor dielectric layer 204 adjacent to and above the bottom plate 202, and a top plate 206 adjacent to and above the capacitor dielectric layer 204, where the top plate 206 is further in contact with a metal electrode 209 without a via. The capacitor 220 includes a bottom plate 212 above the substrate 251, a capacitor dielectric layer 214 adjacent to and above the bottom plate 212, and a top plate 216 adjacent to and above the capacitor dielectric layer 214, where the top plate 216 is further in contact with a metal electrode 219 without a via.

In embodiments, the TFT 239 includes a gate electrode 236 above the substrate 251, a channel layer 232 including a channel material, separated from the gate electrode 236 by a gate dielectric layer 235, and a source electrode 231 and a drain electrode 233 above the channel layer 232. The TFT 239 further includes a capping layer 234 above the channel layer 232. The drain electrode 233 is coupled to the bottom plate 202 by a short via 207 within the ILD layer 254.

In embodiments, the TFT 249 includes a gate electrode 246 above the substrate 251, a channel layer 242 including a channel material, separated from the gate electrode 246 by a gate dielectric layer 245, and a source electrode 241 and a drain electrode 243 above the channel layer 242. The TFT 249 further includes a capping layer 244 above the channel layer 242. The drain electrode 243 is coupled to the bottom plate 212 by a short via 217 within the ILD layer 254.

In embodiments, the gate electrode 236 may be coupled to a first word line of a memory array, the top plate 206 of the capacitor 210 may be coupled to a first bit line of the memory array, and the source electrode 231 may be coupled to a first source line of the memory array. Similarly, the gate electrode 246 may be coupled to a second word line of the memory array, the top plate 216 of the capacitor 220 may be coupled to a second bit line of the memory array, and the source electrode 241 may be coupled to a second source line of the memory array.

In embodiments, the channel layer 232 or the channel layer 242 may include a channel material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

In embodiments, the BEOL 240 may be formed on the FEOL 230. The FEOL 230 may include the substrate 251. In addition, the FEOL 230 may include other devices, e.g., a transistor 264. In embodiments, the transistor 264 may be a FEOL transistor, including a source 261, a drain 263, and a gate 265, with a channel 267 between the source 261 and the drain 263 under the gate 265. Furthermore, the transistor 264 may be coupled to interconnects, e.g., a via 269.

Figure 3:
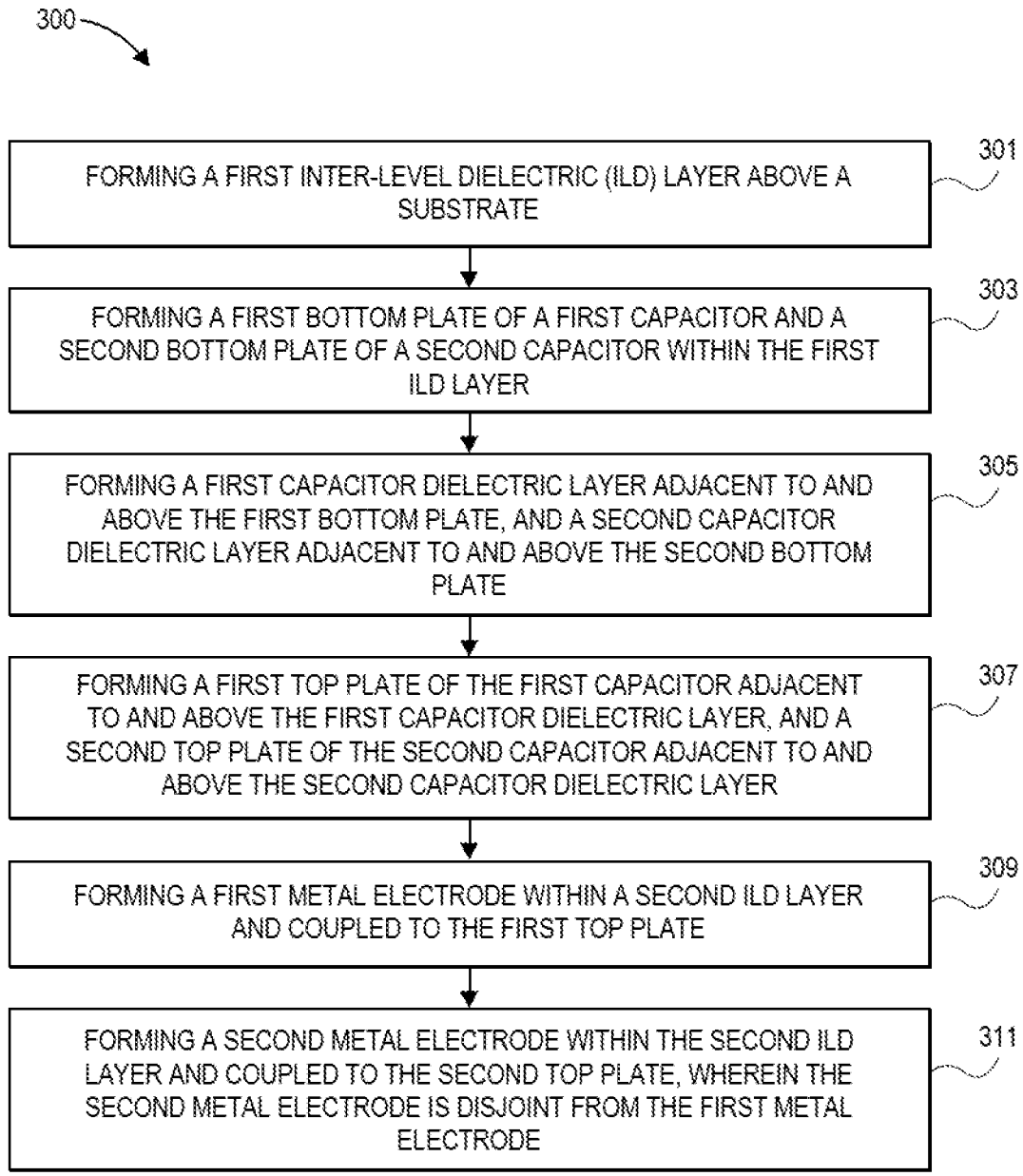
FIG. 3 illustrates a process for forming a semiconductor device including a first capacitor and a second capacitor, in accordance with some embodiments.

FIG. 3 illustrates a process 300 for forming a semiconductor device including a first capacitor and a second capacitor, in accordance with some embodiments. In embodiments, the process 300 may be applied to form the semiconductor device 100 including the capacitor 110 and the capacitor 120, as shown in FIG. 1(a); the semiconductor device 130 including the capacitor 140 and the capacitor 150, as shown in FIG. 1(b); the semiconductor device 160 including the capacitor 170 and the capacitor 180; or the semiconductor device 200 including the capacitor 210 and the capacitor 220, as shown in FIG. 2.

At block 301, the process 300 may include forming a first ILD layer above a substrate. For example, the process 300 may include forming the ILD layer 103 above the substrate 101, as shown in FIG. 1(a).

At block 303, the process 300 may include forming a first bottom plate of a first capacitor and a second bottom plate of a second capacitor within the first ILD layer. For example, the process 300 may include forming the bottom plate 102 of the capacitor 110 and the bottom plate 112 of the capacitor 120 within the ILD layer 103, as shown in FIG. 1(a).

At block 305, the process 300 may include forming a first capacitor dielectric layer adjacent to and above the first bottom plate, and a second capacitor dielectric layer adjacent to and above the second bottom plate. For example, the process 300 may include forming the capacitor dielectric layer 104 adjacent to and above the bottom plate 102, and the capacitor dielectric layer 114 adjacent to and above the bottom plate 112, as shown in FIG. 1(a).

At block 307, the process 300 may include forming a first top plate of the first capacitor adjacent to and above the first capacitor dielectric layer, and a second top plate of the second capacitor adjacent to and above the second capacitor dielectric layer. For example, the process 300 may include forming the top plate 106 adjacent to and above the capacitor dielectric layer 104, and the top plate 116 adjacent to and above the capacitor dielectric layer 114, as shown in FIG. 1(a).

At block 309, the process 300 may include forming a first metal electrode within a second ILD layer and coupled to the first top plate. For example, the process 300 may include forming the metal electrode 109 within the ILD layer 105 and coupled to the top plate 106.

At block 311, the process 300 may include forming a second metal electrode within the ILD layer and coupled to the second top plate, wherein the second metal electrode is disjoint from the first metal electrode. As a result, the first capacitor is accessed through the first metal electrode without accessing the second capacitor through the second metal electrode. For example, the process 300 may include forming the metal electrode 119 within the ILD layer 105 and coupled to the top plate 116. The metal electrode 119 is disjoint from the metal electrode 109. As a result, the capacitor 110 is accessed through the metal electrode 109 without accessing the capacitor 120 through the metal electrode 119.

In addition, the process 300 may include additional operations to form other layers, e.g., ILD layers, encapsulation layers, insulation layers, not shown.

Figure 4:
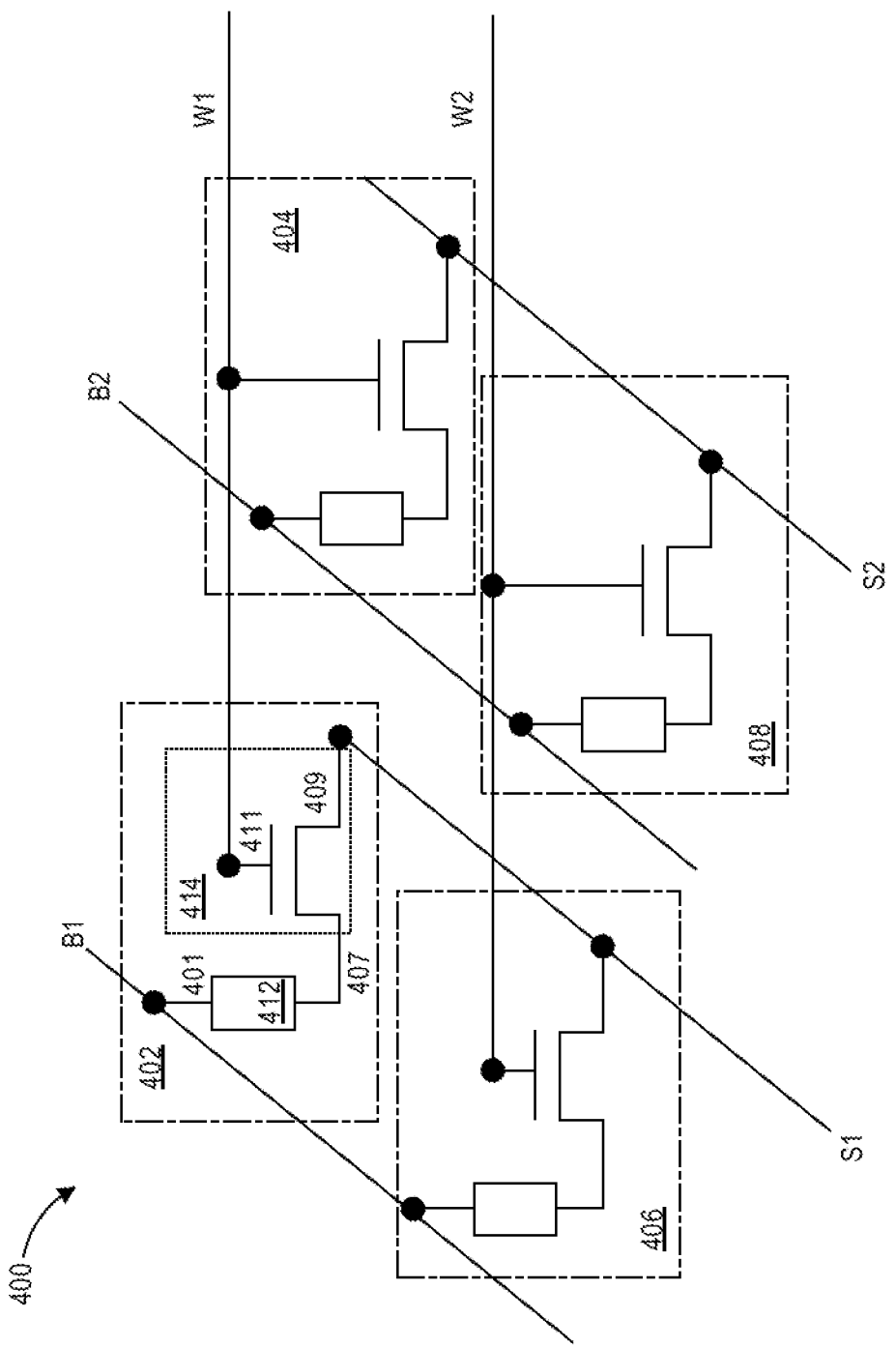
FIG. 4 schematically illustrates a memory array with multiple memory cells including multiple capacitors, in accordance with some embodiments.

FIG. 4 schematically illustrates a memory array 400 with multiple memory cells (e.g., a memory cell 402, a memory cell 404, a memory cell 406, and a memory cell 408), including multiple capacitors separated by a dielectric area, in accordance with some embodiments. A memory cell, e.g., the memory cell 402, may have a transistor, e.g., a transistor 414, as a selector. In embodiments, the memory cell 402 and the memory cell 404 may be examples of the memory cells shown in FIG. 2, where the multiple memory cells include multiple capacitors, e.g., the capacitor 210 and the capacitor 220, where the top plates of the capacitors are coupled to disjoint metal electrodes. The transistor 414 may be a TFT, similar to the TFT 239 or the TFT 249 as shown in FIG. 2. In some other embodiments, the transistor 414 may be a front end transistor having a channel within a substrate.

In embodiments, the multiple memory cells may be arranged in a number of rows and columns coupled by bitlines, e.g., bitline B1 and bitline B2, wordlines, e.g., wordline W1 and wordline W2, and source lines, e.g., source line S1 and source line S2. The memory cell 402 may be coupled in series with the other memory cells of the same row, and may be coupled in parallel with the memory cells of the other rows. The memory array 400 may include any suitable number of one or more memory cells.

In embodiments, multiple memory cells, such as the memory cell 402, the memory cell 404, the memory cell 406, and the memory cell 408, may have a similar configuration. For example, the memory cell 402 may include the transistor 414 coupled to a storage cell 412 that may be a capacitor, which may be called a 1T1C configuration. The memory cell 402 may be controlled through multiple electrical connections to read from the memory cell, write to the memory cell, and/or perform other memory operations.

The transistor 414 may be a selector for the memory cell 402. A wordline W1 of the memory array 400 may be coupled to a gate electrode 411 of the transistor 414. When the wordline W1 is active, the transistor 414 may select the storage cell 412. A bitline B1 of the memory array 400 may be coupled to an electrode 401 of the storage cell 412, while another electrode 407 of the storage cell 412 may be shared with the transistor 414. In addition, a source line S1 of the memory array 400 may be coupled to another electrode, e.g., an electrode 409 of the transistor 414. The shared electrode 407 may be a drain electrode of the transistor 414, while the electrode 409 may be a source electrode of the transistor 414. A drain electrode and a source electrode may be used interchangeably herein. Additionally, a source line and a bit line may be used interchangeably herein. In some other embodiments, the memory cells and the storage cells may be accessibly individually in different bit lines, as illustrated in FIG. 2.

In some embodiments, for the memory array 400, e.g., an eDRAM memory array, multiple memory cells may have source lines or bitlines coupled together and have a constant voltage. In some embodiments, a common connection may be shared among all the rows and all the columns of the memory array 400. When such sharing occurs, the bitline and source line may not be interchangeable.

In various embodiments, the memory cells and the transistors, e.g., the memory cell 402 and the transistor 414, included in the memory array 400 may be formed in BEOL, as shown in FIG. 2. For example, the transistor 414 may be illustrated as the TFT 239 or the TFT 249 shown in FIG. 2 at the BEOL, and the storage cell 412 may be the capacitor 210 or the capacitor 220. Furthermore, a capacitor of the memory cell 402 and a capacitor of the memory cell 404 may have their top plates coupled to disjoint metal electrodes, similar to the top plate 206 coupled to the metal electrode 209, and the top plate 216 coupled to the metal electrode 219. In addition, the memory array 400 may be formed in higher metal layers, e.g., metal layer 3 and/or metal layer 4, of the integrated circuit above the active substrate region, and may not occupy the active substrate area that is occupied by conventional transistors or memory devices. In some other embodiments, the transistor 414 and transistors of other memory cells may be front end transistors with channels within a substrate.

Figure 5:
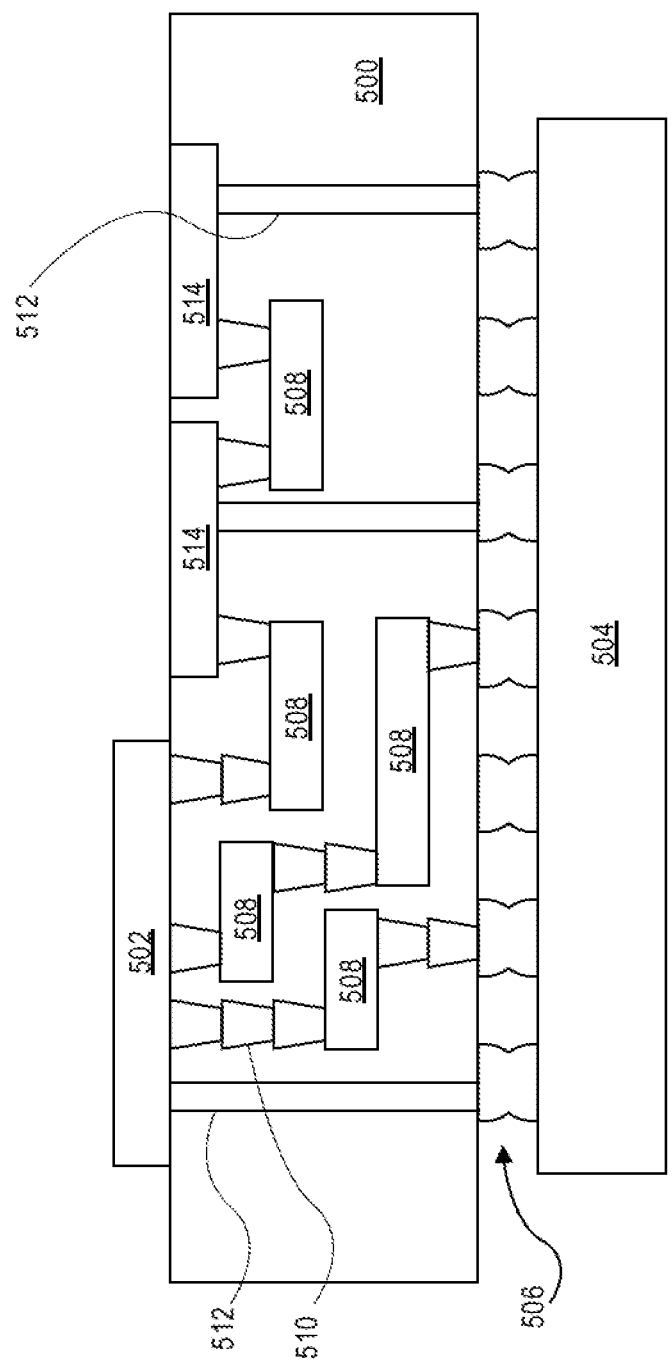
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for multiple memory cells, e.g., the memory cells as shown in FIG. 2, which includes the capacitor 210 and the capacitor 220. The second substrate 504 may be, for instance, a memory module, a computer motherboard, or another integrated circuit die. For example, the second substrate 504 may be a memory module including the memory array 400 as shown in FIG. 4. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, or other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
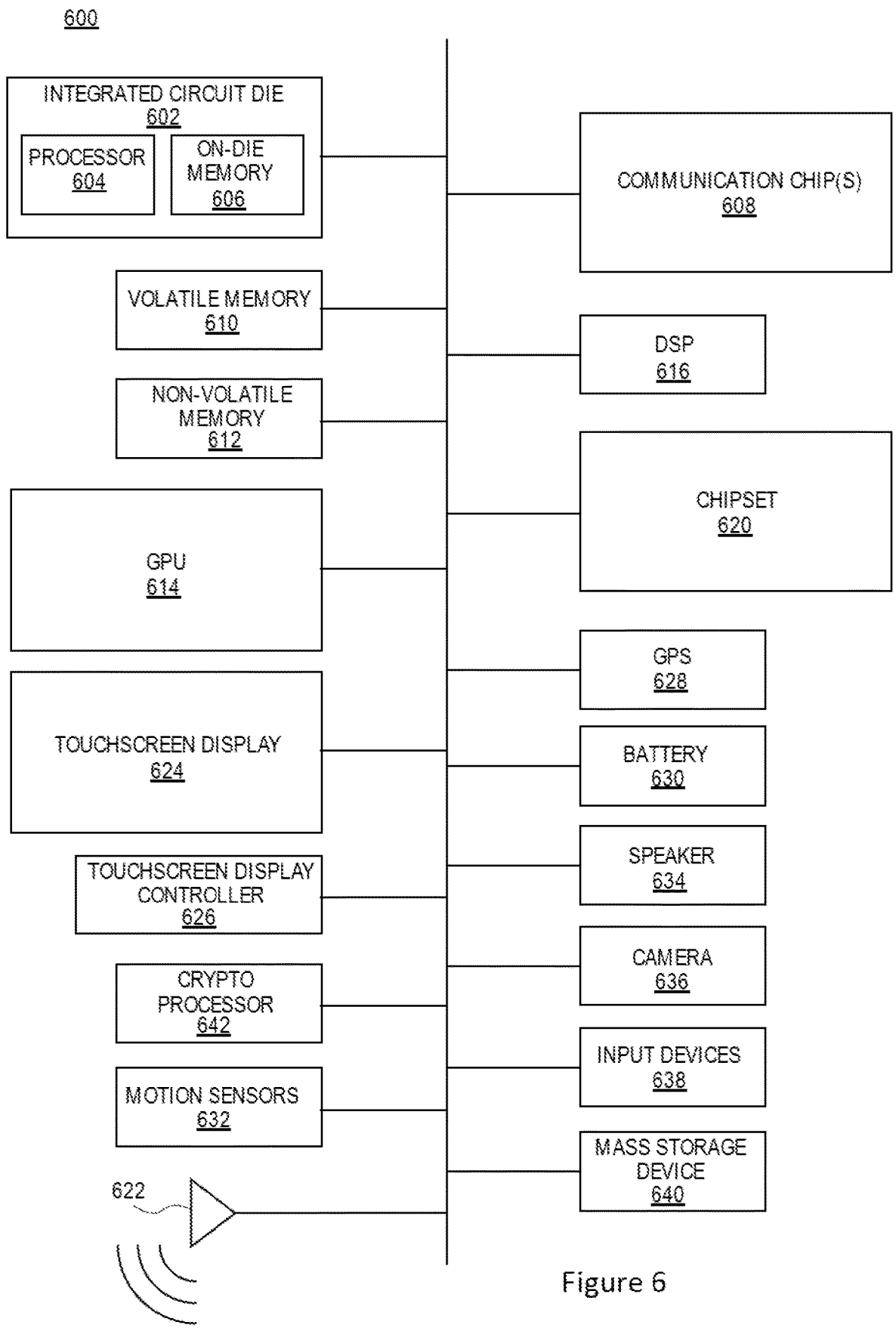
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include multiple memory cells, e.g., the memory cells as shown in FIG. 2, which includes the capacitor 210 and the capacitor 220.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638

(such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., multiple memory cells, e.g., the memory cells as shown in FIG. 2, which includes the capacitor 210 and the capacitor 220. The capacitors included in the multiple memory cells may be similar to the capacitor 110 and the capacitor 120 as shown in FIG. 1(*a*); the capacitor 140 and the capacitor 150 as shown in FIG. 1(*b*); or a semiconductor device formed following the process 300.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: a substrate; a first capacitor including a first top plate and a first bottom plate above the substrate, wherein the first top plate is coupled to a first metal electrode within an inter-level dielectric (ILD) layer to access the first capacitor; and a second capacitor including a second top plate and a second bottom plate, wherein the second top plate is coupled to a second metal electrode within the ILD layer to access the second capacitor, and wherein the second metal electrode is disjoint from the first metal electrode, and the first capacitor is accessed through the first metal electrode without accessing the second capacitor through the second metal electrode.

Example 2 may include the semiconductor device of example 1 and/or some other examples herein, wherein the first metal electrode and the second metal electrode are substantially parallel in a vertical direction with respect to a surface of the substrate, or the first metal electrode and the second metal electrode are substantially coplanar with respect to the surface of the substrate.

Example 3 may include the semiconductor device of example 1 and/or some other examples herein, wherein the first top plate is a via that is in contact with the first metal electrode, and wherein the via is in contact with a first capacitor dielectric layer separating the first bottom plate and the via.

Example 4 may include the semiconductor device of example 1 and/or some other examples herein, wherein the first metal electrode is coupled to the first top plate through a first via in the ILD layer, and the second metal electrode is coupled to the second top plate through a second via in the ILD layer.

Example 5 may include the semiconductor device of examples 1-4 and/or some other examples herein, wherein the ILD layer is a first ILD layer, and wherein the first bottom plate is coupled to a third metal electrode within a second ILD layer, the second bottom plate is coupled to a fourth metal electrode within the second ILD layer, and wherein the fourth metal electrode is disjoint from the third metal electrode.

Example 6 may include the semiconductor device of example 5 and/or some other examples herein, wherein the second ILD layer is a same layer as the first ILD layer.

Example 7 may include the semiconductor device of examples 1-4 and/or some other examples herein, wherein the first capacitor is included in a first bit cell of a memory array, the second capacitor is included in a second bit cell of the memory array, the first metal electrode is coupled to a first bit line of the memory array, and the second metal electrode is coupled to a second bit line of the memory array different from the first bit line.

Example 8 may include the semiconductor device of examples 1-4 and/or some other examples herein, wherein the first bottom plate or the first top plate includes a U-shaped portion.

Example 9 may include the semiconductor device of examples 1-4 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 10 may include the semiconductor device of examples 1-4 and/or some other examples herein, wherein the first bottom plate, the second bottom plate, the first top plate, or the second top plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 11 may include the semiconductor device of examples 1-4 and/or some other examples herein, wherein the first capacitor includes a first capacitor dielectric layer separating the first bottom plate and the first top plate, and the second capacitor includes a second capacitor dielectric layer separating the second bottom plate and the second top plate.

Example 12 may include the semiconductor device of example 11 and/or some other examples herein, wherein the first capacitor dielectric layer or the second capacitor dielectric layer includes an area of a square shape, a rectangular shape, a U-shape, or a polygon comprising three or more sides.

Example 13 may include the semiconductor device of example 10 and/or some other examples herein, wherein the first capacitor dielectric layer or the second capacitor dielectric layer includes one or more high-k dielectric materials selected from the group consisting of hafnium silicate, zirconium silicate, hafnium dioxide, hafnium zirconate, zirconium dioxide, aluminum oxide, titanium oxide, silicon nitride, carbon doped silicon nitride, silicon carbide, and nitride hafnium silicate.

Example 14 may include the semiconductor device of examples 1-4 and/or some other examples herein, further comprising: a transistor above the substrate, wherein the transistor includes a gate electrode above the substrate, a channel layer including a channel material, separated from the gate electrode by a gate dielectric layer, and a source electrode and a drain electrode above the channel layer; and wherein the drain electrode is coupled to the first bottom plate of the first capacitor or the second bottom plate of the second capacitor.

Example 15 may include the semiconductor device of example 14 and/or some other examples herein, wherein the first bottom plate of the first capacitor or the second bottom plate of the second capacitor is coupled to the drain electrode by a short via within the ILD layer.

Example 16 may include the semiconductor device of example 14 and/or some other examples herein, wherein the gate electrode is coupled to a word line of a memory array, the first top plate of the first capacitor is coupled to a first bit line of the memory array, the second top plate of the second capacitor is coupled to a second bit line of the memory array, and the source electrode is coupled to a source line of the memory array.

Example 17 may include a method for forming a semiconductor device, the method comprising: forming a first inter-level dielectric (ILD) layer above a substrate; forming a first bottom plate of a first capacitor and a second bottom plate of a second capacitor within the first ILD layer; forming a first capacitor dielectric layer adjacent to and above the first bottom plate, and a second capacitor dielectric layer adjacent to and above the second bottom plate; forming a first top plate of the first capacitor adjacent to and above the first capacitor dielectric layer, and a second top plate of the second capacitor adjacent to and above the second capacitor dielectric layer; forming a first metal electrode within a second ILD layer and coupled to the first top plate; and forming a second metal electrode within the second ILD layer and coupled to the second top plate, wherein the second metal electrode is disjoint from the first metal electrode so that the first capacitor is accessed through the first metal electrode without accessing the second capacitor through the second metal electrode.

Example 18 may include the method of example 17 and/or some other examples herein, wherein the first metal electrode and the second metal electrode are substantially parallel in a vertical direction with respect to a surface of the substrate, or the first metal electrode and the second metal electrode are substantially coplanar with respect to the surface of the substrate.

Example 19 may include the method of examples 17-18 and/or some other examples herein, further comprising: forming a first via coupled to the first top plate and the first metal electrode; and forming a second via coupled to the second top plate and the second metal electrode; wherein the first via and the second via are at least partially through the first ILD layer or the second ILD layer.

Example 20 may include the method of examples 17-18 and/or some other examples herein, further comprising: forming a third metal electrode coupled to the first bottom plate; and forming a fourth metal electrode coupled to the second bottom plate.

Example 21 may include a computing device, comprising: a circuit board; and a memory device coupled to the circuit board and including a memory array, wherein the memory array includes a plurality of memory cells, a first memory cell of the plurality of memory cells includes a first transistor and a first capacitor, and a second memory cell of the plurality of memory cells includes a second transistor and a second capacitor; wherein the first capacitor includes a first bottom plate and a first top plate, the first top plate coupled to a first metal electrode within an inter-level dielectric (ILD) layer to access the first capacitor; and wherein the second capacitor includes a second top plate and a second bottom plate, wherein the second top plate is coupled to a second metal electrode within the ILD layer to access the second capacitor, and wherein the second metal electrode is disjoint from the first metal electrode, and the first capacitor is accessed through the first metal electrode without accessing the second capacitor through the second metal electrode.

Example 22 may include the computing device of example 21 and/or some other examples herein, wherein the first metal electrode and the second metal electrode are substantially parallel in a vertical direction with respect to a surface of the substrate, or the first metal electrode and the second metal electrode are substantially coplanar with respect to the surface of the substrate.

Example 23 may include the computing device of examples 21-22 and/or some other examples herein, wherein the ILD layer is a first ILD layer, and wherein the first bottom plate is coupled to a third metal electrode within a second ILD layer, the second bottom plate is coupled to a fourth metal electrode within the second ILD layer, and wherein the fourth metal electrode is disjoint from the third metal electrode.

Example 24 may include the computing device of examples 21-22 and/or some other examples herein, wherein the first transistor or the second transistor includes a channel material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 25 may include the computing device of examples 21-22 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a capacitor including a bottom plate above the substrate, and a capacitor dielectric layer above and within the bottom plate, the capacitor dielectric layer having an uppermost surface at a same level as an uppermost surface of the bottom plate in a cross-sectional view, and the capacitor including a conductive via on the uppermost surface of the capacitor dielectric layer, wherein the conductive via has a smaller lateral dimension than the capacitor dielectric layer and the bottom plate in the cross-sectional view at a location directly above the uppermost surface of the capacitor dielectric layer; and
   a metal electrode coupled to the conductive via.

2. The semiconductor device of claim 1, wherein the metal electrode is substantially coplanar with respect to a surface of the substrate.

3. The semiconductor device of claim 1, further comprising an interlayer dielectric (ILD) layer above the bottom plate and the capacitor dielectric layer, wherein the conductive via and the metal electrode are in the ILD layer.

4. The semiconductor device of claim 1, further comprising an interlayer dielectric (ILD) layer below the bottom plate and the capacitor dielectric layer.

5. The semiconductor device of claim 4, further comprising a second conductive via in the ILD layer.

6. The semiconductor device of claim 1, further comprising a first interlayer dielectric (ILD) layer above the bottom plate and the capacitor dielectric layer, wherein the conductive via and the metal electrode are in the first ILD layer; and
   a second ILD layer below the bottom plate and the capacitor dielectric layer.

7. The semiconductor device of claim 6, further comprising a second conductive via in the second ILD layer.

8. The semiconductor device of claim 1, wherein the capacitor is included in a bit cell of a memory array, and the metal electrode is coupled to a bit line of the memory array.

9. The semiconductor device of claim 1, wherein the bottom plate includes a U-shaped portion.

10. The semiconductor device of claim 1, wherein the bottom plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

11. A computing device, comprising:
    a circuit board; and
    a memory device coupled to the circuit board and including a memory array, wherein the memory array includes a plurality of memory cells, a memory cell of the plurality of memory cells includes a transistor coupled to a capacitor;
    wherein the capacitor includes a bottom plate above a substrate, and a capacitor dielectric layer above and within the bottom plate, the capacitor dielectric layer having an uppermost surface at a same level as an uppermost surface of the bottom plate in a cross-sectional view, and the capacitor including a conductive via on the uppermost surface of the capacitor dielectric layer, wherein the conductive via has a smaller lateral dimension than the capacitor dielectric layer and the bottom plate in the cross-sectional view at a location directly above the uppermost surface of the capacitor dielectric layer.

12. The computing device of claim 11, further comprising a metal electrode coupled to the conductive via of the capacitor.

13. The computing device of claim 12, further comprising an interlayer dielectric (ILD) layer above the bottom plate and the capacitor dielectric layer, wherein the conductive via and the metal electrode are in the ILD layer.

14. The computing device of claim 11, further comprising an interlayer dielectric (ILD) layer below the bottom plate and the capacitor dielectric layer.

15. The computing device of claim 14, further comprising a second conductive via in the ILD layer.

16. The computing device of claim 11, further comprising a battery coupled to the circuit board.

17. The computing device of claim 11, further comprising a display coupled to the circuit board.

18. The computing device of claim 11, further comprising a camera coupled to the circuit board.

19. The computing device of claim 11, further comprising a GPS coupled to the circuit board.

20. The computing device of claim 11, further comprising a sensor coupled to the circuit board.

\* \* \* \* \*